(12) United States Patent
Okabe et al.

(10) Patent No.: US 11,488,644 B2
(45) Date of Patent: Nov. 1, 2022

(54) SEMICONDUCTOR DEVICE AND READING METHOD

(71) Applicant: Winbond Electronics Corp., Taichung (TW)

(72) Inventors: Sho Okabe, Kanagawa (JP); Makoto Senoo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/320,224

(22) Filed: May 14, 2021

(65) Prior Publication Data

US 2022/0044712 A1 Feb. 10, 2022

(30) Foreign Application Priority Data

Aug. 5, 2020 (JP) ............................. JP2020-133183

(51) Int. Cl.
*G11C 7/10* (2006.01)
*G11C 7/12* (2006.01)

(52) U.S. Cl.
CPC ............ *G11C 7/1048* (2013.01); *G11C 7/106* (2013.01); *G11C 7/1057* (2013.01); *G11C 7/12* (2013.01)

(58) Field of Classification Search
CPC ..... G11C 7/1048; G11C 7/1057; G11C 7/106; G11C 2211/5642; G11C 2211/5643; G11C 16/0483; G11C 16/24; G11C 16/26; G11C 16/32; G11C 16/10; G11C 16/30
USPC ............................................ 365/185.24, 203
See application file for complete search history.

(56) References Cited

U.S. PATENT DOCUMENTS

| | | | | |
|---|---|---|---|---|
| 6,252,814 B1* | 6/2001 | Tran | ...................... | G11C 7/227 365/210.1 |
| 2001/0005015 A1* | 6/2001 | Futatsuyama | .......... | G11C 16/08 365/185.17 |
| 2001/0032223 A1* | 10/2001 | Hayakawa | ................ | G06F 7/74 708/211 |
| 2008/0013378 A1* | 1/2008 | Crippa | ............... | G11C 16/3454 365/189.05 |
| 2008/0055991 A1* | 3/2008 | Kim | ................... | G11C 16/3454 365/185.11 |
| 2010/0034020 A1* | 2/2010 | Tanaka | ................... | G11C 16/30 365/185.21 |
| 2010/0074026 A1* | 3/2010 | Kang | ................... | G11C 11/5642 365/185.25 |
| 2011/0157999 A1* | 6/2011 | Yoon | ...................... | G11C 16/10 365/189.05 |
| 2014/0104947 A1 | 4/2014 | Yamauchi et al. | | |
| 2014/0254270 A1* | 9/2014 | Maejima | ................ | G11C 16/08 365/185.11 |

(Continued)

FOREIGN PATENT DOCUMENTS

| | | |
|---|---|---|
| JP | 5323170 | 10/2013 |
| JP | 5667143 | 2/2015 |

*Primary Examiner* — Michael T Tran
(74) *Attorney, Agent, or Firm* — JCIPRNET (57) ABSTRACT

A semiconductor device capable of performing high-speed read or high-reliability read is provided. A reading method of a NAND flash memory includes: pre-charging a sensing node through a voltage-supply node; discharging the sensing node to the voltage-supply node for a prescribed operation; recharging the sensing node by the voltage-supply node after the prescribed operation; and discharging a NAND string and sensing a memory cell.

12 Claims, 8 Drawing Sheets

(56) References Cited

U.S. PATENT DOCUMENTS

| | | | |
|---|---|---|---|
| 2016/0180947 A1* | 6/2016 | Lim | G11C 29/04 |
| | | | 365/185.11 |
| 2016/0217863 A1* | 7/2016 | An | G11C 16/16 |
| 2016/0225437 A1* | 8/2016 | Kumar | G11C 8/16 |
| 2016/0240232 A1* | 8/2016 | Lee | H01L 27/1052 |
| 2016/0247580 A1* | 8/2016 | Chen | G11C 17/16 |
| 2016/0267988 A1* | 9/2016 | Ogawa | G11C 16/3459 |
| 2017/0186484 A1* | 6/2017 | Takada | G11C 11/5642 |
| 2019/0362765 A1* | 11/2019 | Park | G11C 11/39 |
| 2021/0035647 A1* | 2/2021 | Senoo | G11C 16/26 |
| 2022/0020404 A1* | 1/2022 | Cho | G11C 7/106 |
| 2022/0068388 A1* | 3/2022 | Shin | G11C 16/08 |
| 2022/0122687 A1* | 4/2022 | Yang | G11C 29/022 |
| 2022/0208246 A1* | 6/2022 | Choi | G11C 11/4096 |

* cited by examiner

SEMICONDUCTOR DEVICE AND READING METHOD

CROSS-REFERENCE TO RELATED APPLICATION

This application claims the priority benefit of Japan application serial no. 2020-133183, filed on Aug. 5, 2020. The entirety of the above-mentioned patent application is hereby incorporated by reference herein and made a part of this specification.

BACKGROUND

Technical Field

The present disclosure relates to a semiconductor device including a NAND flash memory, and particularly relates to a recovery method of a sensing node of a page buffer/sensing circuit.

Description of Related Art

The NAND flash memory is equipped with a continuous read function (a burst read function) that continuously reads multiple pages in response to external commands. A page buffer/sensing circuit includes, for example, two latches. During a continuous reading operation, while one of the latches holds the data read from the array, the data held in the other latch is output (for example, JP 5323170, JP 5667143, US2014/0104947A1, etc.).

In the reading operation of the NAND flash memory, in order to receive the charge from the sensing node more accurately, the latch of the page buffer needs to be reset, and the reset is performed before the pre-charging period of the bit line. Particularly, in a continuous reading operation, the reset of the latch must be performed after the data of the latch is transferred to another latch and before the pre-charge of the bit line of the next page is read. If the speed of the continuous reading operation is increased, it may not secure the time for resetting the latch sufficiently.

To avoid the above situation, resetting the latch after pre-charging the bit line and before discharging the NAND string may be taken into consideration. The reset of the latch makes the node of the latch connected electrically to the ground (GND) potential level, but if the discharge path of the node of the latch is set as a voltage-supply node, there is no need to provide a reset transistor. However, in the above case, there are sensing nodes on the discharge path at intervals, so the sensing nodes are also discharged to the GND potential level at the same time. Therefore, the sensing node must be restored to the original voltage again after the reset of the latch. If the recovery of the sensing node takes more time, the reading time also takes longer, thereby making the voltage of the sensing node be used for the sensing of a discharged memory cell of the NAND string. Therefore, it needs to restore the original voltage even more accurately.

In a bit-line mask reading, the even-numbered bit line or the odd-numbered bit line is selected to pre-charge the selected bit line, so that the unselected bit line becomes the GND potential level, and the time taken to discharge the potential of the unselected bit line to the GND potential level is longer than the time taken to pre-charge the selected bit line to the clamping voltage. This is because when the selected bit line is pre-charged to the clamp voltage, the potential of the unselected bit line rises temporarily through the capacitive coupling of the selected bit line and the unselected bit line, and then the discharge to the GND potential level is performed, where the RC time constant is large. In order to avoid reading disturbance, the discharge of the NAND string of the selected bit line is performed after the unselected bit line finishes discharging. However, while waiting for the discharge of the unselected bit line to finish, the clamp voltage of the pre-charge of the selected bit line gradually increases, and the voltage of the selected bit line offsets from the clamp voltage. The offset of the clamping voltage affects the sensing accuracy of the memory cell, so this situation should be avoided as much as possible.

Therefore, it is considered that, after the selected bit line is pre-charged to the clamp voltage, the selected bit line is blocked from the voltage-supply node, so that the voltage of the selected bit line does not offset from the clamp voltage during the period until the unselected bit line finishes discharging.

As a method of blocking the selected bit line from the voltage-supply node, a transistor BLPRE connected between the selected bit line and the voltage-supply node may be turned off, and when the transistor BLPRE is turned off, a sensing node SNS is in a floating state. As the layout of the page buffer/sensing circuit is complex, the sensing node SNS may be affected by unexpected noise. Therefore, it is not preferable to make the sensing node SNS in a floating state. Assuming that the charge of the sensing node is discharged to the voltage-supply node and that the sensing node is fixed to the GND potential level, the sensing node needs to be restored to the original voltage again after the discharge of the unselected bit line is completed. If the recovery time of the sensing node takes a longer time, the reading time takes longer, which affects the voltage of the sensing node used for the sensing of the memory cell after the NAND string is discharged. Therefore, it is necessary to restore the original voltage more accurately.

SUMMARY

In view of such existing problems, the present disclosure aims to provide a semiconductor device capable of high-speed reading and high-reliability reading.

The reading method of the NAND flash memory of the present disclosure includes: a first step of pre-charging a sensing node by the voltage from the voltage-supply node; a second step of discharging a voltage of the sensing node to the voltage-supply node to perform a prescribed operation; a third step of recharging the sensing node by the voltage from the voltage-supply node after the prescribed operation; and after the third step, a fourth step of discharging a NAND string and performing sensing of a memory cell.

In one embodiment of the present disclosure, the prescribed operation is resetting a latch circuit of a page buffer/sensing circuit. The prescribed operation includes an operation of making a selected bit line to be in a floating state during a period until the unselected bit line finishes discharging. In a comparison result, the driving capability of the voltage-supply node in the third step is equal to or greater than the driving capability of the voltage-supply node in the first step. The driving capability of the voltage-supply node in the third step changes in stages. The reading method further includes a fifth step of connecting electrically the selected bit line to the sensing node after the sensing node is recharged.

The semiconductor device of the present disclosure includes: a NAND memory cell array; a reading member, which reads data from a selected page of the memory cell array; and an output member, which outputs the data read by the reading member to the outside, and the reading member includes a page buffer/sensing circuit connected to the memory cell array via a bit line, and after pre-charging the sensing node by a voltage from a voltage-supply node, the reading member discharges a voltage of the sensing node to the voltage-supply node before discharging the NAND string to perform a prescribed operation, and recharges the sensing node by a voltage from the voltage-supply node after the prescribed operation.

In one embodiment of the present disclosure, the prescribed operation is resetting a latch circuit of a page buffer/sensing circuit. The prescribed operation includes an operation of making a selected bit line to be in a floating state during a period until an unselected bit line finishes discharging. The reading member includes a bit-line selection circuit connected to the page buffer/sensing circuit, the bit-line selection circuit includes an even-numbered selection transistor for selecting an even-numbered bit line and an odd-numbered selection transistor for selecting an odd-numbered bit line, the prescribed operation makes the even-numbered selection transistor or the odd-numbered selection transistor non-conducting, and makes the selected even-numbered bit line or odd-numbered bit line to be in a floating state. The reading member includes a driving circuit for driving the voltage-supply node, and the driving circuit recharges the sensing node with a driving capability equal to or greater than a driving capability when the bit line is pre-charged. The driving circuit responds to a switching control signal and supplies a supply voltage or a reference potential to the voltage-supply node, and the driving circuit responds to a plurality of drive signals and changes a driving capability of a supply voltage of the voltage-supply node. The page buffer/sensing circuit includes: a voltage-supply node, a sensing node, a latch circuit, a first selection transistor connected between the voltage-supply node and the sensing node, a second selection transistor connected between the sensing node and a bit line, and a third selection transistor connected between the sensing node and the latch circuit, and the reading member makes the first selection transistor and the third selection transistor conducting, makes the second selection transistor non-conducting, and connects the latch circuit electrically to a reference potential of the voltage-supply node to reset the latch circuit. The page buffer/sensing circuit includes: a voltage-supply node, a sensing node, a latch circuit, a first selection transistor connected between the voltage-supply node and the sensing node, a second selection transistor connected between the sensing node and the bit line, and a third selection transistor connected between the sensing node and the latch circuit, and the reading member makes the first selection transistor conducting, makes the second selection transistor and the third selection transistor non-conducting, connects the sensing node electrically to a reference potential of the voltage-supply node, and makes the selected bit line to be in a floating state. The page buffer/sensing circuit further includes other latch circuits that receive data held in the latch circuit, and when the reading member performs continuous reading, the latch circuit holds data read from the next selected page of the memory cell array during a period in which data of other latch circuits is output.

According to the present disclosure, the sensing node is restored after the bit line is pre-charged, so high-speed reading and high-reliability reading operations may be performed.

DESCRIPTION OF THE EMBODIMENTS

In order to achieve compatibility with the NOR flash memory, the NAND flash memory is equipped with a serial peripheral interface (SPI) and has the ability to synchronize with an external clock signal and read multiple pages continuously.

Figure 1:
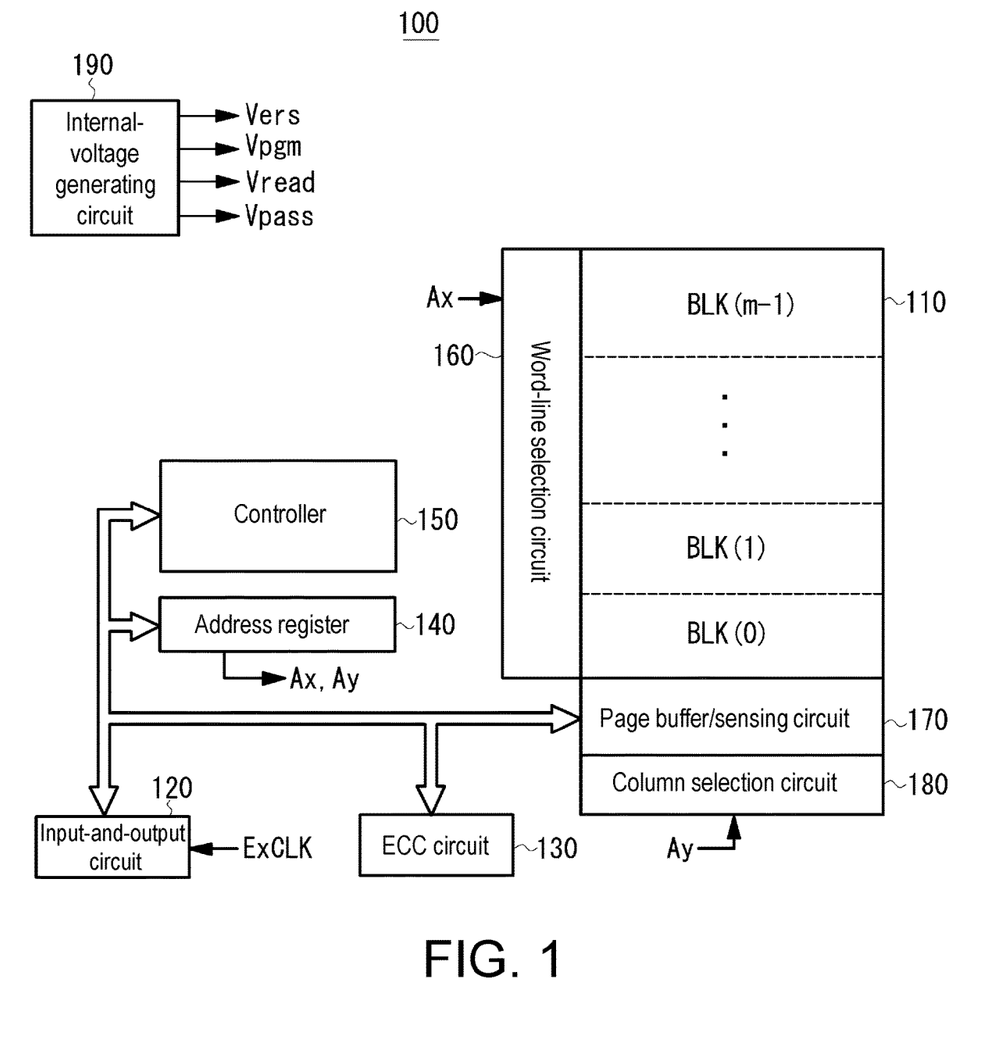
FIG. 1 is a block diagram of the structure of a NAND flash memory according to an embodiment of the present disclosure.

FIG. 1 is a diagram of the structure of a NAND flash memory according to an embodiment of the present disclosure. A flash memory 100 of this embodiment includes the following components: a memory cell array 110 in which a plurality of memory cells are disposed in a matrix; an input-and-output circuit 120, connected to external input-and-output terminals, and adapted to respond to an external clock signal ExCLK and output the read data to the outside or input the data from the outside; an error checking and correction (ECC) circuit 130, adapted to perform error checking and correction on the symbol generation of the data to be programmed or the read data; an address register 140, adapted to receive address data via the input-and-output circuit 120; a controller 150, adapted to control each part based on the command data received via the input-and-output circuit 120 or the control signal applied to the terminal; a word-line selection circuit 160, adapted to receive row address information Ax from the address register 140, decode the row address information Ax, and perform block selection, word line selection, etc. based on the decoding result; a page buffer/sensing circuit 170, adapted to hold the data read from the page selected by the word-line selection circuit 160, or hold the data to be programmed to the selected page; a column selection circuit 180, adapted to receive column address information Ay from the address register 140, decode the column address information Ay, and perform column selection and the like in the page buffer/sensing circuit 170 based on the decoding result; and an internal-voltage generating circuit 190 generates various voltages (a program voltage Vpgm, a pass voltage Vpass, a reading voltage Vread, an erasing voltage Vers, etc.) required for reading, programming, and erasing data.

Figure 2:
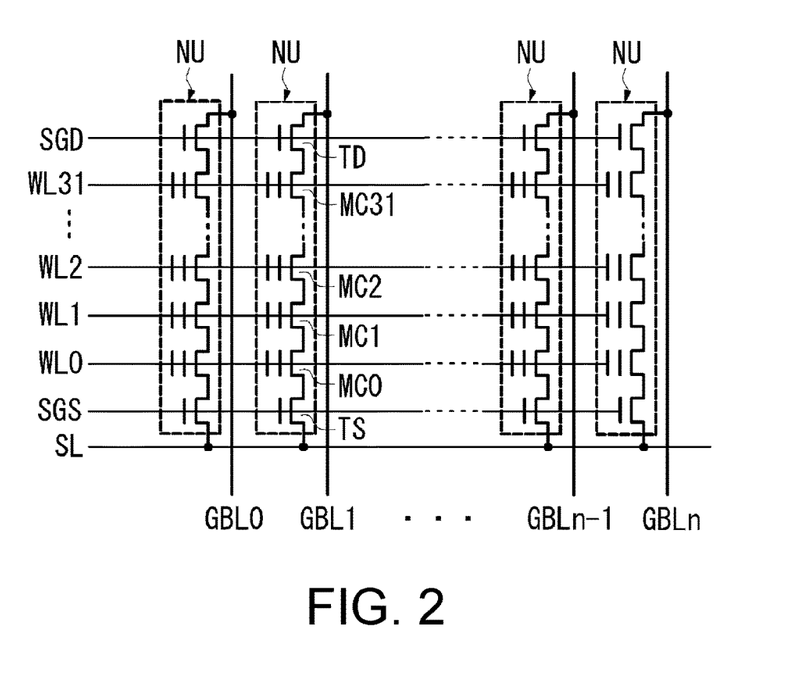
FIG. 2 is a diagram of an example of the structure of a NAND string in a flash memory according to an embodiment of the present disclosure.

The memory cell array 110 has, for example, "m" number of memory blocks BLK(0), BLK(1) . . . , BLK(m-1)

disposed in the column direction. As shown in FIG. 2, a memory block includes a plurality of NAND strings, an NAND string NU includes a plurality of memory cells MCi (for example, i=0, 1, . . . , 31) connected in series, a bit-line side selection transistor TD, and a source-line side selection transistor TS. The drain of the bit-line side selection transistor TD is connected to a corresponding bit line GBL among the bit lines GBL0 to GBLn, and the source of the source-line side selection transistor TS is connected to a common source line SL. The control gate of the memory cell MCi is connected to a word line WLi, and the gates of the bit-line side selection transistor TD and the source-line side selection transistor TS are respectively connected to a selection gate line SGD and a selection gate line SGS. The word-line selection circuit 160 selects a block or a word through the selection gate line SGD and the selection gate line SGS to drive the bit-line side selection transistor TD and the source-line side selection transistor TS based on the row address information Ax.

The NAND string may be formed two-dimensionally on the surface of the substrate or three-dimensionally in the vertical direction from the surface of the substrate. In addition, the memory cell may store single-level cell (SLC) that stores one bit (binary data), and it can also be a multi-level cell (MLC) that stores multiple bits.

Figure 3:
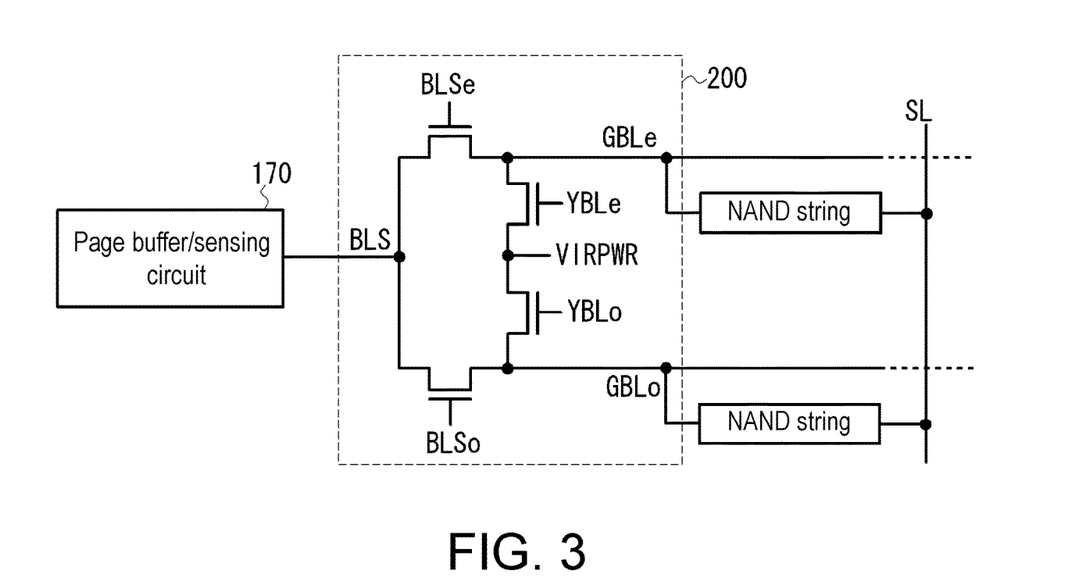
FIG. 3 is a diagram of the structure of a bit-line selection circuit of a flash memory according to an embodiment of the present disclosure.

The configuration of the bit-line selection circuit is shown in FIG. 3. FIG. 3 illustrates one page buffer/sensing circuit 170 shared by one even-numbered bit line GBLe and one odd-numbered bit line GBLo, and a bit-line selection circuit 200 connected thereto.

The bit-line selection circuit 200 includes: a transistor BLSe adapted to select the even-numbered bit line GBLe, a transistor BLSo adapted to select the odd-numbered bit line GBLo, a transistor YBLe adapted to connect a virtual power supply VIRPWR to the even-numbered bit line GBLe, a transistor YBLo adapted to connect the virtual power supply VIRPWR to the odd-numbered bit line GBLo, where a NAND string is connected between the even-numbered bit line GBLe and the source line SL, and a NAND string is connected between the odd-numbered bit line GBLo and the source line SL. For example, in a reading operation, mask reading is performed. When selecting the even-numbered bit line GBLe, the odd-numbered bit line GBLo is not selected, and when selecting the odd-numbered bit line GBLo, the even-numbered bit line GBLe is not selected. The unselected bit line is connected to the GND potential level through the virtual power supply VIRPWR.

Figure 4A:
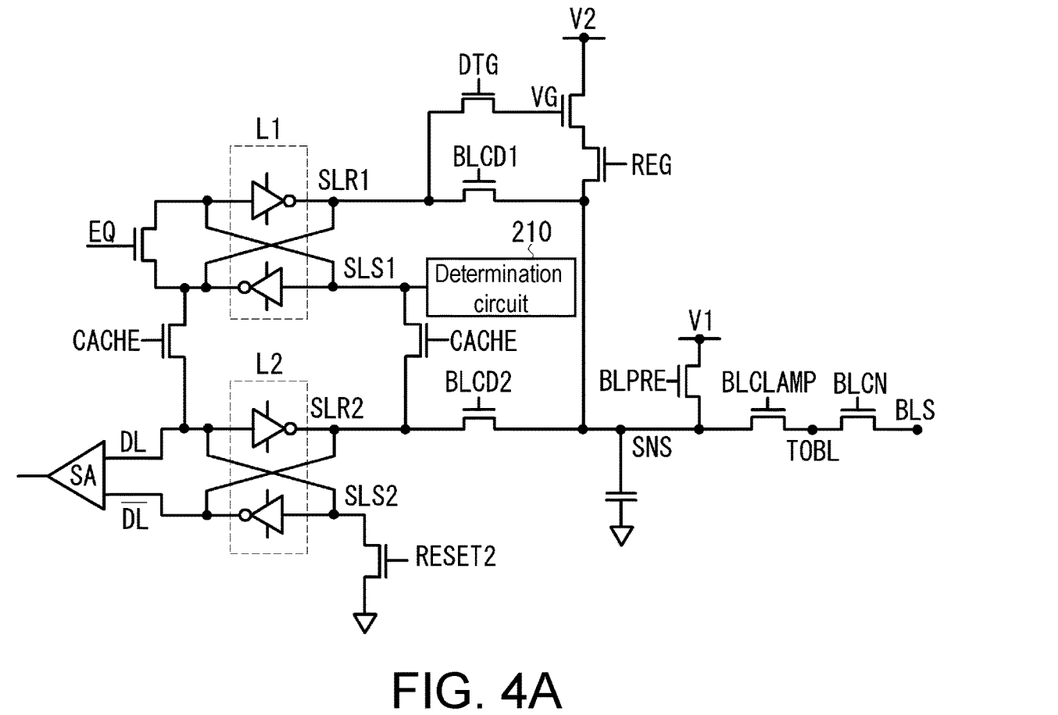
FIG. 4A and FIG. 4B are diagrams of the structure of a page buffer/sensing circuit of a flash memory according to the embodiment of the present disclosure.

The structure of the page buffer/sensing circuit 170 is shown in FIG. 4A. FIG. 4A shows a page buffer/sensing circuit. For the sake of convenience, it is assumed that the signal applied to the gate of the transistor represents a transistor. The page buffer/sensing circuit 170 includes two latches, latches L1 and L2. A transfer gate (a transistor CACHE) is connected between the latch L1 and the latch L2, which may perform bidirectional data transfer from the latch L1 to the latch L2, or from the latch L2 to the latch L1, by conducting the transfer gate.

The latch L1 includes a pair of cross-coupled inverters. A node SLR1 of the latch L1 is connected to a common source/drain (S/D) of a transistor BLCD1 and a transistor DTG. And the node SLS1 is connected to a determination circuit 210. The determination circuit 210 determines, for example, whether program verification or eraser verification is qualified. During the program verification or the like, when the node SLR1 is selectively charged to Vdd from a voltage-supply node V2 or when the node SLR1 is selectively discharged to GND, the transistor DTG is conducted, such that the latch L1 may make the node SLR1 and the node SLS1 a short-circuit through a transistor EQ.

The node SLR1 and the node SLS1 of the latch L1 are respectively connected to the node SLS2 and the node SLR2 of the latch L2 via the transistor CACHE. The node SLR2 of the latch L2 is connected to the sensing node SNS via a transistor BLCD2, and the node SLS2 is connected to a transistor RESET2. When the latch L2 is reset, the transistor RESET2 is conducted. In addition, the node SLS2 and the node SLR2 are connected to a differential sense amplifier SA via a data line DL and a data line /DL, and the output of the differential sense amplifier SA is connected to the input-and-output circuit 120.

A transistor VG and a transistor REG are connected in series between the voltage-supply node V2 and the sensing node SNS, and the gate of the transistor VG is connected to the S/D of the transistor DTG. The voltage-supply node V1 is connected to the sensing node SNS via a transistor BLPRE. The voltage-supply node V1 supplies the internal supply voltage Vdd when the bit line is pre-charged, and supplies the GND potential level when the latch L1 is reset or when the selected bit line is in a floating state. A transistor BLCN and a transistor BLCLAMP are connected in series and connected between the sensing node SNS and the node BLS of the bit-line selection circuit 200.

Figure 4B:
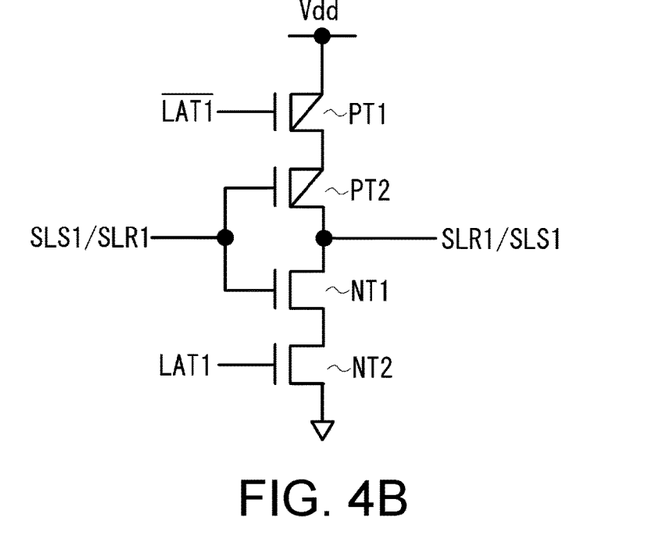

The circuit structure of an inverter that constitutes the latch L1 is shown in FIG. 4B. The inverter includes four transistors connected in series, namely a P-type transistor PT1, a P-type transistor PT2, a N-type transistor NT1, and a N-type transistor NT2. Each of the gates of the transistor PT1 and the transistor NT2 is input with a latch enable signal /LAT1 and a latch enable signal LAT1, and the common gate of the transistor PT2 and the transistor NT1 are input with the voltage of the node SLS1/SLR. When the latch enable signal LAT1 is at the H potential level, the inverter may operate. When the latch enable signal LAT1 is at the L potential level, the transistor PT2 and the transistor NT1 are in a tri-state separated from the internal supply voltages Vdd and GND, so that the inverter can be reset. The reset of the latch L1 is performed by using a current path passing through the sensing node SNS. Therefore, when the sensing node SNS is free, the reset is performed when the sensing node SNS is not adversely affected.

Figure 5:
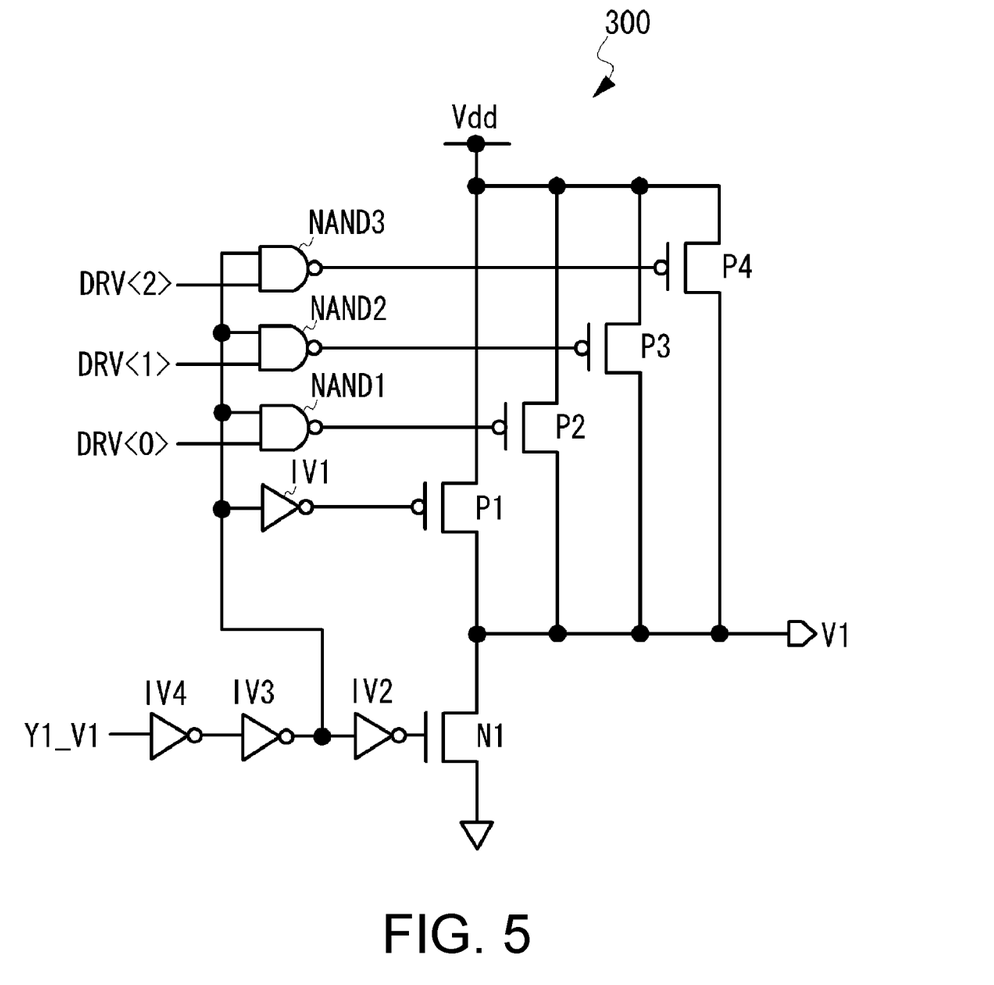
FIG. 5 is a diagram of the structure of a driving circuit of a voltage-supply source according to an embodiment of the present disclosure.

FIG. 5 shows a driving circuit for driving a voltage-supply node V1. A driving circuit 300 includes: a plurality of positive channel metal oxide semiconductor (PMOS) transistors P1, P2, P3, and P4 that are connected in parallel between a Vdd node and the output node V1; and an negative channel metal oxide semiconductor (NMOS) transistor N1 that is connected between the output node V1 and the GND. The driving capability (drain current) of the transistor P1, the transistor P2, the transistor P3, and the transistor P4 may be equal, or they may be set as P1<P2<P3<P4. In the latter case, the drive capacity is set to, for example, P2=2×P1, P3=4×P1, and P4=8×P1. The driving capability may be changed according to the gate width of the transistor or the ratio of the gate width to the gate length.

The gates of the transistor P1, the transistor P2, the transistor P3, and the transistor P4 are connected to the output of an inverter IV1 and NAND1, NAND2, and NAND3. Apply the output of an inverter IV3 to one of the inputs of the NAND1, NAND2, and NAND3 in a shared manner, and apply a drive signal DRV<0>, a drive signal DRV<1>, and a drive signal DRV<2> to another input of the NAND1, NAND2, and NAND3, respectively. An inverter IV2, the inverter IV3, and an inverter IV4 are connected in series to the gate of an NMOS transistor N1. A switching control signal Y1_V1 is input to the inverter IV4.

A controller 150 outputs the drive signal DRV<0>, the drive signal DRV<1>, the drive signal DRV<2>, and the switching control signal Y1_V1 to the driving circuit 300 during the reading operation. When the switching control signal Y1_V1 is at the H potential level, the internal supply voltage Vdd is generated at the output node V1. And when the switching control signal Y1_V1 is at the L potential level, the GND potential level is generated at the output node V1. In addition, when the drive signal DRV<0>, the drive signal DRV<1>, and the drive signal DRV<2> are all at the H potential level, all the transistors P1, P2, P3, and P4 are conducted, and the driving ability is at their maximum. And when the drive signal DRV<0>, the drive signal DRV<1>, and the drive signal DRV<2> are all at the L potential level and only the transistor P1 is conducted, the driving capability is their minimum.

The word-line selection circuit 160 and the column selection circuit 180 (see FIG. 1) select the reading start position of the data in the page according to the row address information Ax and the column address information Ay, or they automatically read the data from the beginning of the page without using the column address and row address. Furthermore, the word-line selection circuit 160 and the column selection circuit 180 may include a row address counter and a column address counter that increment the row address and the column address in response to a clock signal.

In the reading operation of the flash memory, a certain positive voltage is applied to the bit line, a certain voltage (for example, 0 V) is applied to the selected word line, a pass voltage Vpass (for example, 4.5 V) is applied to the unselected word line, and a positive voltage (for example, 4.5 V) is applied to the selection gate lines SGD and SGS, so as to conduct the bit-line side select transistor TD and the source-line side selection transistor TS and apply 0 V to the common source line. In the programming operation, a high-voltage programming voltage Vpgm (15 V to 20 V) is applied to the selected word line, and an intermediate potential (for example, 10 V) is applied to the unselected word line, so as to conduct the bit-line side selection transistor TD, cut off the source-line side selection transistor TS, and supply the bit line with potential corresponding to "0" or "1" data. In the erasing operation, 0 V is applied to the selected word line in the block, and a high voltage (such as 20 V) is applied to the P-well, and by extracting electrons from the floating gate to the substrate, data is erased in units of blocks.

Figure 6:
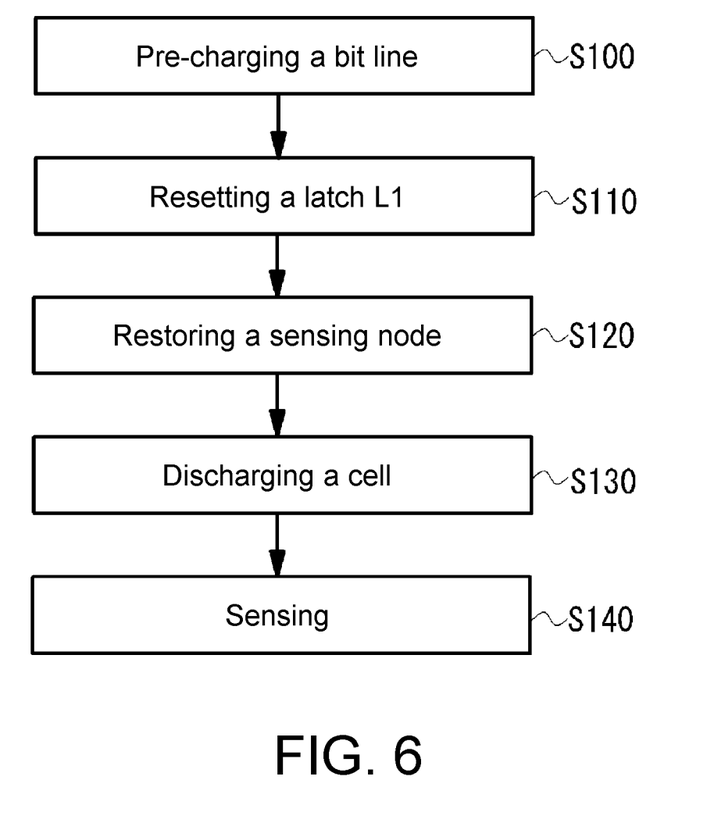
FIG. 6 is a flowchart of a reading operation based on the first embodiment of the present disclosure.

Next, a description is given based on the reading operation of the first embodiment of the present disclosure. FIG. 6 is a flowchart of the sequence of the reading operation in the first embodiment. The reading operation in this embodiment includes: a step of pre-charging the bit line (S100), a step of resetting the latch L1 after the pre-charge (S110), a step of restoring the sensing node SNS after the reset of the latch L1 (S120), a step of discharging the memory cell of the NAND string (S130), and a step of performing the sensing of the sensing node SNS (S140).

In the pre-charge of the bit line, first, the controller 150 converts the voltage-supply node V1 into the supply voltage Vdd through the driving circuit 300 via the switching control signal Y1_V1. At this time, the controller 150 may change the driving capability of the driving circuit 300 from the minimum to the maximum through the drive signal DRV<0>, the drive signal DRV<1>, and the drive signal DRV<2>. The transistor BLPRE is conducted, the sensing node SNS is charged to the Vdd potential level, so as to conduct the transistor BLCLAMP and the transistor BLCN, and the node BLS is charged to VCLMP1. It is in the relationship of Vdd≥VCLMP1. The transistor BLCD1, the transistor BLCD2, and the transistor REG are made to be non-conducting, so as to conduct the transistor BLSe (here, it is set to select the even-numbered bit line GBLe), and the node BLS is connected electrically to the even-numbered bit line GBLe. The bit-line side selection transistor TD of the NAND string connected to the even-numbered bit line GBLe is conducted, so as to make the source-line side selection transistor TS non-conducting, and a pass voltage is applied to the selected page and the unselected page. Accordingly, the even-numbered bit line GBLe is pre-charged with the clamp voltage VCLMP1, whereas the unselected odd-numbered bit line GBLo is connected electrically to the GND of the virtual power supply VIRPWR via the transistor YBLo.

Figure 7:
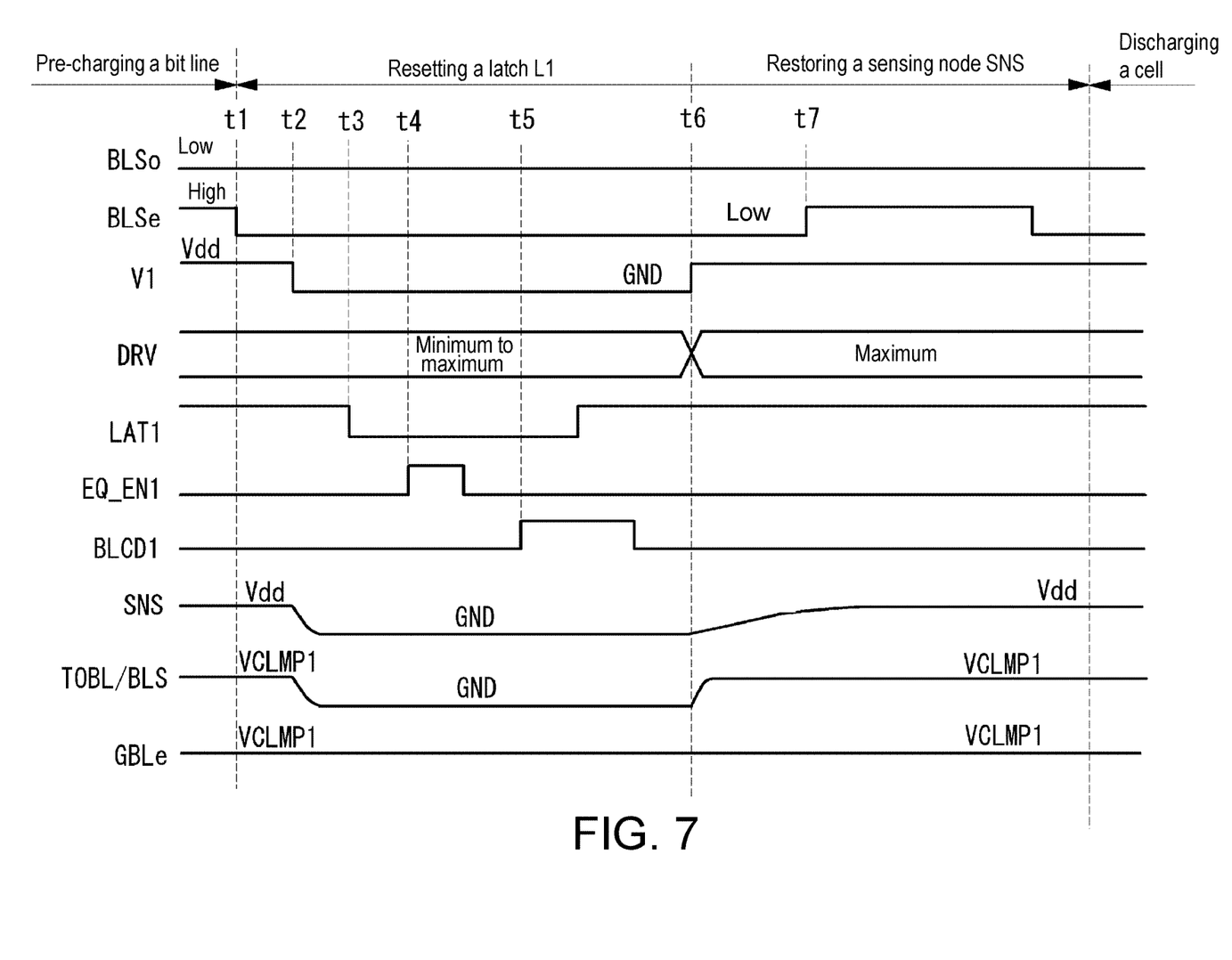
FIG. 7 is a time sequence chart of a reading operation based on the first embodiment of the present disclosure.

When the pre-charge of the bit line finishes, the latch L1 is reset. FIG. 7 shows a time sequence chart of the reset of the latch L1 and the recovery of the sensing node. During the reset period, the transistor BLPRE, the transistor BLCN, and the transistor BLCLAMP are in a conducting state. At time t1, the transistor BLSe is non-conducting (L potential level), and the even-numbered bit line GBLe is electrically separated from the page buffer/sensing circuit 170. Next, at time t2, the controller 150 converts the voltage-supply node V1 to GND through the driving circuit 300 via the switching control signal Y1_V1. As a result, the sensing node SNS drops from the supply voltage Vdd to the GND potential level, whereas the nodes TOBL and the node BLS drop from the clamp voltage VCLMP1 to the GND potential level.

Then, at time t3, the latch enable signal LAT1 for resetting the latch L1 is switched from the H potential level to the L potential level, and the latch L1 is placed in a resettable state. Next, at time t4, the transistor EQ is conducted for a certain period of time, and after the nodes SLR1 and SLS1 are short-circuited at the same potential, at time t5, the transistor BLCD1 is conducted for a certain period of time. As a result, the charge of the node SLR1 is discharged to the GND of the voltage-supply node V1 via the sensing node SNS, and the reset of the latch L1 is completed.

After the reset of the latch L1, the recovery of the sensing node SNS and the like is performed. That is, the sensing node SNS, the node TOBL, and the node BLS are recharged, returning the voltage of these nodes to the pre-charging state before the reset of the latch L1. At time t6, the controller 150 converts the voltage-supply node V1 from GND to the supply voltage Vdd through the driving circuit 300 via the switching control signal Y1_V1. As a result, the sensing node SNS is recharged to Vdd, and the node TOBL and the node BLS are recharged to the clamp voltage VCLMP1. At this time, the controller 150 converts all the drive signal DRV<0>, the drive signal DRV<1>, and the drive signal DRV<2> to the H potential level, so as to conduct the transistor P1 to the transistor P4, and the sensing node SNS is charged with the maximum driving capability, so that the recovery time of the sensing node SNS is shortened. Alternatively, the controller 150 converts the drive signal DRV<0>, the drive signal DRV<1>, and the drive signal DRV<2> to the H potential level in stages between time t6 and time t7 (for example, one or more of the transistor P1, the transistor P2, the transistor P3, and the transistor P4 are selected to be conducted in stages to increase the driving capability gradually), such that finally, the transistor P1 to transistor P4 are conducted, charging the sensing node SNS with the maximum drive capacity, thereby suppressing the coupling received by the gate voltage of the transistor BLCLAMP from the sensing node SNS, and shortening the recovery time of the sensing node SNS simultaneously.

After the recovery of the sensing node SNS, at time t7, the transistor BLSe is conducted (H potential level), the even-numbered bit line GBLe is connected electrically to the page buffer/sensing circuit 170, and the voltage error generated between the node TOBL and the node BLS (recharged to the clamp voltage VCLMP1 by restoring) and the even-numbered bit line GBLe (charged to the clamp voltage VCLMP1 by the pre-charge of the bit line) are corrected. After that, the discharge and sensing of the NAND string are performed in the same manner as in the past (not shown in the figures). That is, during the discharge of the NAND string, the transistor BLSe is made non-conducting, and the source-line side selection transistor TS of the NAND string is made conducting, and the NAND string is connected electrically to the source line SL. And, the gate voltage for generating the clamp voltage VCLMP2 at the node TOBL is applied to the transistor BLCLAMP. VCLMP1>VCLMP2. After that, by conducting the transistor BLSe for a certain period of time, the sensing node SNS displays the potential corresponding to the data "0" and the data "1" of the selected memory cell. If the selected memory cell holds the data "0", then the potential of the bit line is not discharged to the source line SL, and therefore the potential of the sensing node SNS hardly changes. However, in contrast, if the selected memory cell holds the data "1", the potential of the bit line is discharged to the source line SL, and the potential of the sensing node SNS decreases. In this way, the sensing node SNS senses and selects the charges corresponding to the data "0" and the data "1" of the memory cell. Thereafter, the charge sensed by the sensing node SNS is transferred to the node SLR1 of the latch L1 via the transistor BLCD1.

The reading method of this embodiment is particularly suitable for continuous reading in which multiple pages are continuously read. After the controller 150 receives the command of the continuous reading operation of the page via the input-and-output circuit 120, the continuous reading of multiple pages starts from the start address. The continuous reading finishes when a command to end the continuous reading is input, or when there is a predetermined end address when performing the reading. In the continuous reading of pages, since the period in which the data is output from the latch L2, the data read from the selected page of the memory cell array is transmitted to the latch L1. The data transmitted from the latch L1 to the latch L2 is not performed in units of 1 page, but divided into ½ pages (a first cache memory or a second cache memory). During the period in which the data in one of the caches of the latch L2 is transmitted to the input-and-output circuit 120, the data of the other cache is processed by the ECC circuit 130. The data transmitted to the input-and-output circuit 120 and the external clock signal ExCLK (for example, rising edge and falling edge) are output to the outside from the external input-and-output terminal synchronously. The reading of data from the memory cell array and the data transmission from the latch L1 to the latch L2 are performed based on an internal clock signal. The data transmission between the latch L2 and the input-and-output circuit 120 as well as the data output from the input-and-output circuit 120 are performed based on the external clock signal ExCLK. The data transmission between the latch L2 and the ECC circuit 130 as well as the operation of the ECC circuit are performed based on other internal clock signals or clock signals obtained by dividing the frequency of the external clock signal ExCLK.

When reading the selected page of the memory cell array, the sensing node SNS reads the potential of the selected bit line, and then the charge of the sensing node SNS is transferred to the node SLR1 of the latch L1 via the transistor BLCD1. For the latch L1, if the transferred charge is above the threshold value, it is determined as data "1", and if it is less than the threshold value, it is determined as data "0" and the data is retained. The latch L1 resets the potential of the node SLR1 to the GND potential level so as to reflect the charge transferred from the sensing node SNS accurately. When resetting the latch L1, the controller 150 converts the voltage-supply node V1 to GND through the driving circuit 300 via the switching control signal Y1_V1, conducting the transistor BLCD1 and the transistor BLPRE, and the node SLR1 is connected electrically to the voltage-supply node V1.

In the continuous reading of the existing flash memory, the reset of the latch L1 is performed before the pre-charge of the bit line when reading the next page. However, the reset of the latch L1 must be performed after the data of the latch L1 is transmitted to the latch L2. When the data output speeds up, it may not secure the time for resetting the latch 1 sufficiently. In this embodiment, the reset of the latch L1 is performed between the pre-charging period of the bit line and the discharge period of the NAND string. Therefore, the time for resetting the latch L1 may be secured, and after the data of the latch L1 is transmitted to the latch L2, the array reading may start immediately.

Figure 8:
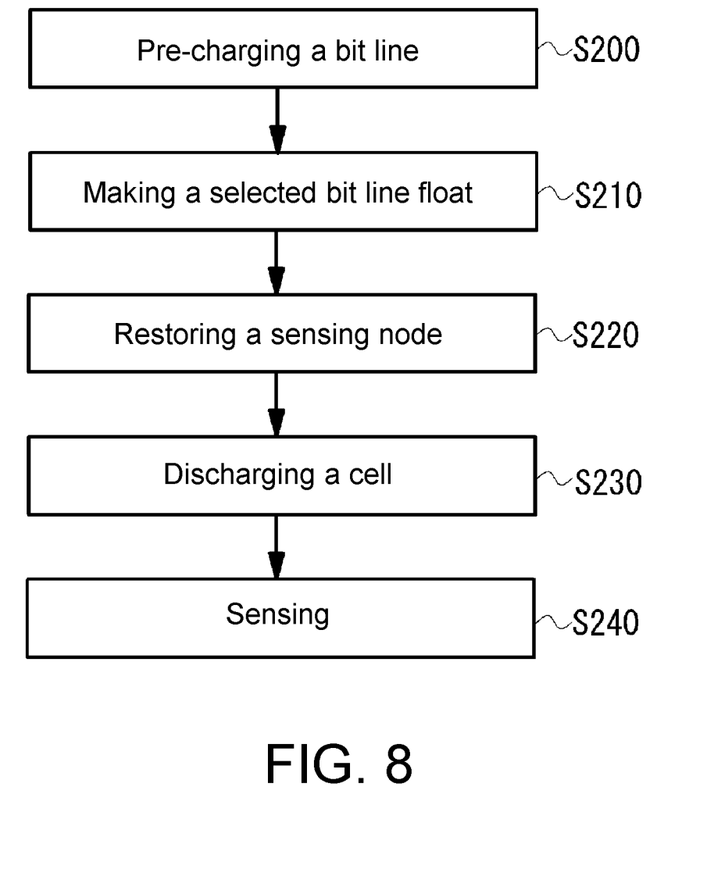
FIG. 8 is a flowchart of a reading operation based on the second embodiment of the present disclosure.

Next, the second embodiment of the present disclosure is described. FIG. 8 is a flowchart of the sequence of the reading operation in the second embodiment. The reading operation of this embodiment includes: a step of pre-charging a bit line (S200), a step of making the selected bit line to be in a floating state after the pre-charge (S210), a step of restoring the sensing node SNS (S220), a step of discharging the memory cell of the NAND string (S230), and a step of performing the sensing of the sensing node SNS (S240).

Figure 9:
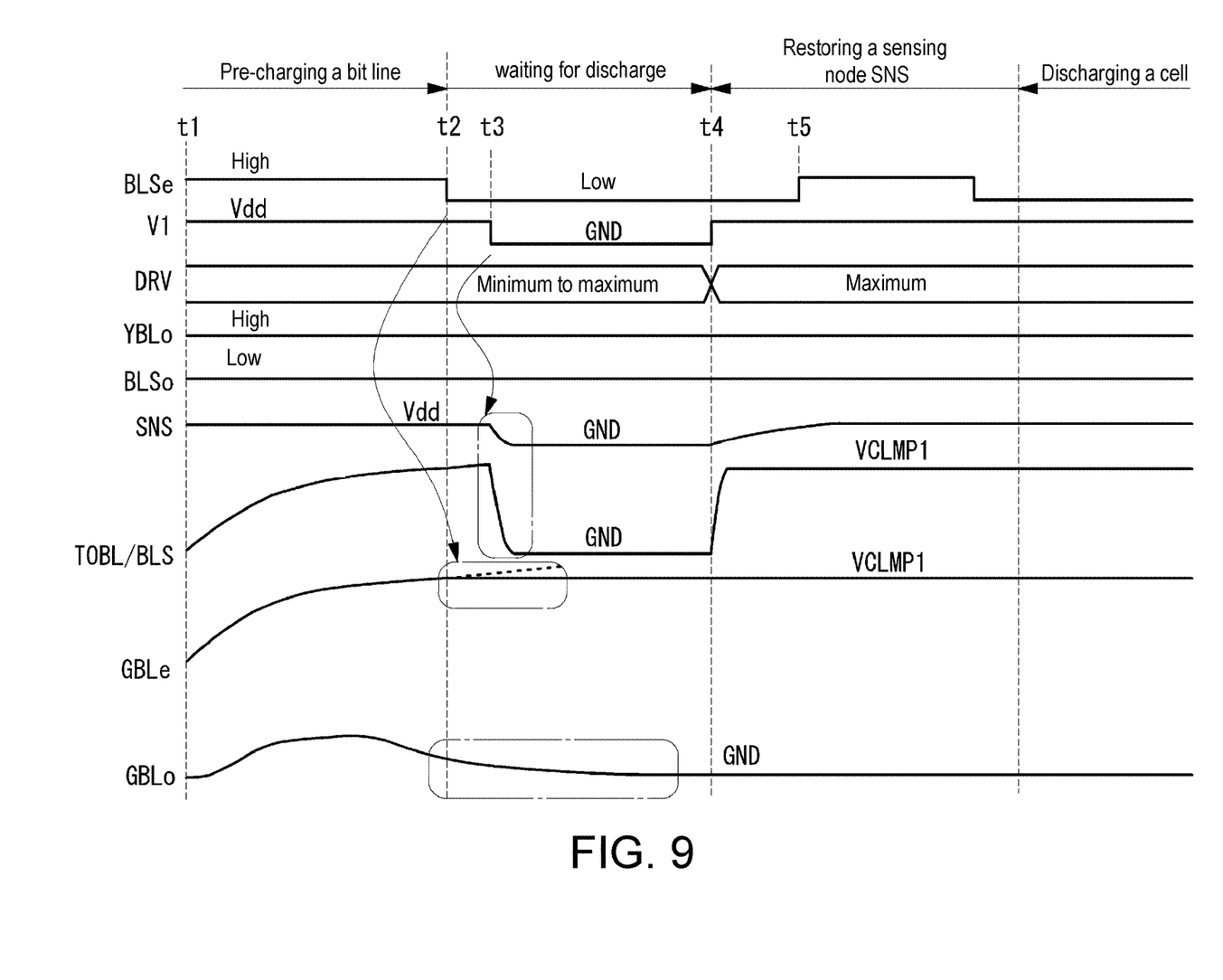
FIG. 9 is a time sequence chart of a reading operation based on the second embodiment of the present disclosure.

FIG. 9 shows a time sequence chart of the reading operation of the second embodiment. In the pre-charge of the bit line, as explained in the first embodiment, at time t1, the charging of the sensing node SNS, the node TOBL, and the node BLS is started through the voltage Vdd supplied from the voltage-supply node V1. In addition, the transistor BLSe is conducted (H potential level), and the charging of the selected bit line GBLe is started (it is assumed that the even-numbered bit line is selected here). Regarding the unselected bit line GBLo, the transistor BLSo is non-conducting (L potential level) and is isolated from the node BLS, and the transistor YBLo is conducting and connected electrically to the virtual power supply VIRPWR (GND potential level).

When the voltage of the selected bit line GBLe rises, the voltage of the unselected bit line GBLo also rises due to the capacitive coupling between the bit lines. After the voltage of the selected bit line GBLe rises to a certain level, the voltage of the unselected bit line GBLo saturates, and after that, it drops to the GND potential level at a slow speed. This is because the RC time constant of the bit line is large. The speed at which the voltage of the selected bit line GBLe rises can be appropriately adjusted according to the supply capacity of the driving circuit 300.

At time t2, when the selected bit line GBLe reaches the pre-charging voltage VCLMP1, the controller 150 makes the transistor BLSe non-conducting (L potential level), the selected bit line GBLe is isolated from the node BLS, and the selected bit line GBLe is in a floating state. As before, when the transistor BLSe is kept conducting at time t2, the gate voltage of the transistor BLCLAMP that actually generates the clamp voltage VCLMP1 has an offset voltage. Therefore, the voltage of the selected bit line GBLe rises from the pre-charging voltage VCLMP1 as shown by the dashed line.

At time t3, the controller 150 converts the voltage-supply node V1 to GND through the driving circuit 300 via the switching control signal Y1_V1. At this time, the transistor BLPRE, the transistor BLCLAMP, and the transistor BLCN are conducting, whereas the transistor REG, the transistor BLCD1, and the transistor BLCD2 are not conducting, and the sensing node SNS, the node TOBL, and the node BLS are connected electrically to the voltage-supply node V1 and are fixed to the GND potential level. The sensing node SNS, the node TOBL, and the node BLS are not in a floating state. Therefore, there is no change made due to unexpected noise.

While the selected bit line GBLe is in the floating state, the unselected bit line GBLo is discharged to the GND potential level. In other words, in the period when waiting for the unselected bit line GBLo to reach the GND potential level, the selected bit line GBLe is in a floating state.

At time t4, the controller 150 converts the voltage-supply node V1 from GND to the supply voltage Vdd through the driving circuit 300 via the switching control signal Y1_V1. And the sensing node SNS is recharged to Vdd, and the node TOBL and the node BLS are recharged to the voltage VCLMP1. At this time, the controller 150 converts all the drive signal DRV<0>, the drive signal DRV<1>, and the drive signal DRV<2> to the H potential level to maximize the driving capability of the driving circuit 300, and thereby shortening the time for recharging. However, the driving capability does not necessarily need to be at its maximum, but can be determined according to the time allowed for the recovery of the sensing node.

At time t5, the controller 150 makes the transistor BLSe conducting (H potential level), the selected bit line GBLe is connected electrically to the page buffer/sensing circuit 170, and the voltage error generated between the node TOBL and the node BLS (by being recharged to the clamp voltage VCLMP1 by recovery) and the selected bit line GBLe (by being pre-charged through the bit line to the clamping voltage VCLMP1) is corrected. After that, as in the first embodiment, the discharge of the memory cells of the NAND string is performed, and the sensing of the sensing node SNS is performed.

In sum, according to this embodiment, the sensing node is restored (recharged) after the bit line is pre-charged, and thus during the pre-charging period of the bit line, the selected bit line is in a float state, and the sensing node SNS, the node TOBL, and the node BLS are fixed to the GND potential level, so as to prevent the selected bit line from rising to an undesirable voltage while waiting for the unselected bit line to reach the GND potential level. Its result is the improvement of the reliability of the reading operation.

The preferred embodiments of the present disclosure have been described in detail, but the present disclosure is not limited to specific embodiments, and various modifications and changes can be made within the scope of the gist of the present disclosure described in the claims.

What is claimed is:

1. A reading method of a NAND flash memory, comprising:
   a first step, pre-charging a sensing node by a voltage from a voltage-supply node;
   a second step, discharging a voltage of the sensing node to the voltage-supply node to perform a prescribed operation;
   a third step, after the prescribed operation, recharging the sensing node by the voltage from the voltage-supply node; and
   a fourth step, after the third step, discharging a NAND string and performing sensing of a memory cell,
   wherein the prescribed operation comprises resetting a latch circuit of a page buffer/sensing circuit or making a selected bit line to be in a floating state during a period until an unselected bit line finishes discharging.

2. The reading method according to claim 1, wherein a driving capability of the voltage-supply node in the third step is equal to or greater than a driving capability of the voltage-supply node in the first step.

3. The reading method according to claim 1, wherein in the third step, a driving capability of the voltage-supply node changes in stages.

4. The reading method according to claim 1, further comprising a fifth step of connecting electrically a selected bit line to the sensing node after the sensing node is recharged.

5. A semiconductor device, comprising:
   a NAND memory cell array;
   a reading member, reading data from a selected page of the memory cell array; and
   an output member, outputting the data read by the reading member to an outside, wherein
   the reading member comprises a page buffer/sensing circuit connected to the memory cell array via a bit line,
   after pre-charging a sensing node by a voltage from a voltage-supply node, the reading member discharges a voltage of the sensing node to the voltage-supply node before discharging a NAND string to perform a prescribed operation, and recharges the sensing node by the voltage from the voltage-supply node after the prescribed operation.

6. The semiconductor device according to claim 5, wherein
   the prescribed operation comprises resetting a latch circuit of the page buffer/sensing circuit or making a selected bit line to be in a floating state during a period until an unselected bit line finishes discharging.

7. The semiconductor device according to claim 5, wherein
   the reading member comprises a bit-line selection circuit connected to the page buffer/sensing circuit, and the bit-line selection circuit comprises an even-numbered selection transistor for selecting an even-numbered bit line and an odd-numbered selection transistor for selecting an odd-numbered bit line,
   the prescribed operation makes the even-numbered selection transistor or the odd-numbered selection transistor non-conducting, and makes the selected even-numbered bit line or the selected odd-numbered bit line to be in a floating state.

8. The semiconductor device according to claim 5, wherein
   the reading member comprises a driving circuit for driving the voltage-supply node, and the driving circuit recharges the sensing node with a driving capability equal to or greater than a driving capability when the bit line is pre-charged.

9. The semiconductor device according to claim 8, wherein
   the driving circuit responds to a switching control signal and supplies a supply voltage or a reference potential to the voltage-supply node, and the driving circuit responds to a plurality of drive signals and changes a driving capability of the supply voltage of the voltage-supply node.

10. The semiconductor device according to claim 6, wherein the page buffer/sensing circuit comprises: the voltage-supply node, the sensing node, the latch circuit, a first selection transistor connected between the voltage-supply node and the sensing node, a second selection transistor connected between the sensing node and the bit line, and a third selection transistor connected between the sensing node and the latch circuit, and the reading member makes the first selection transistor and the third selection transistor conducting, makes the second selection transistor non-conducting, and connects the latch circuit electrically to a reference potential of the voltage-supply node to reset the latch circuit.

11. The semiconductor device according to claim 6, wherein the page buffer/sensing circuit comprises: the voltage-supply node, the sensing node, the latch circuit, a first selection transistor connected between the voltage-supply node and the sensing node, a second selection transistor connected between the sensing node and the bit line, and a third selection transistor connected between the sensing node and the latch circuit, and the reading member makes the first selection transistor conducting, makes the second selection transistor and the third selection transistor non-conducting, and connects the sensing node electrically to a reference potential of the voltage-supply node, and makes the selected bit line to be in a floating state.

12. The semiconductor device according to claim 10, wherein the page buffer/sensing circuit further comprises other latch circuits that receive data held in the latch circuit, and when the reading member performs continuous reading, the latch circuit holds data read from a next selected page of the memory cell array during a period in which data of the other latch circuits is output.

* * * * *